BIDIRECTIONAL DIRECT CURRENT TRANSISTOR AMPLIFIER

Filed April 20, 1964

INVENTORS
A. L. WENNERBERG
A. F. MARTZ
BY
Hughes, Rothwell, Mion & Zinn
ATTORNEYS United States Patent Office 3,332,029
Patented July 18, 1967

3,332,029

BIDIRECTIONAL DIRECT CURRENT TRANSISTOR AMPLIFIER

Allan L. Wennerberg, St. Joseph, Mich., and Arthur F. Martz, Cranbury, N.J., assignors to Whirlpool Corporation, a corporation of Delaware Filed Apr. 20, 1964, Ser. No. 360,845
3 Claims. (Cl. 330—30)

ABSTRACT OF THE DISCLOSURE

A bidirectional direct current transistor amplifier for smoothly changing the magnitude and direction of a direct current through a load. In changing direction through the load, the current passes smoothly through the zero value without any discontinuity. The circuit is symmetrical and contains pairs of driver, amplifier, load and control transistors all of the same conductivity type. A differential input signal is applied to the driver transistors. One amplifier transistor drives current through a load in one direction when the input signal is of one relative polarity, and the other amplifier transistor drives current through the load in the other direction when the input signal is of the opposite relative polarity. Each load transistor is biased so that it becomes saturated when its associated amplifier transistor supplies the load current. Especially at load currents near zero, both load transistors are conducting and the difference in the degree of conduction of the two load transistors increases as the algebraic difference of the differential signal applied to the driver transistors increases.

This invention relates generally to a direct current transistor amplifier and, more particularly, to a bidirectional direct current transistor amplifier for smoothly changing the magnitude and direction of a direct current through a load.

A problem which arises when conventional direct current transistor amplifiers are utilized to drive large loads of the order of 10 amperes is the prohibitive amount of power dissipated in the individual transistor collector load resistors.

Therefore, the primary object of this invention is to provide a direct current transistor amplifier wherein only a negligible amount of power is dissipated in the amplifier transistor circuits themselves.

Another important object of this invention is to provide a bidirectional direct current transistor amplifier circuit for smoothly and continuously supplying a load with a current of variable magnitude in either polarity in accordance with the magnitude and polarity of an input signal.

A more specific object of this invention is to provide a direct current differential transistor amplifier circuit in which the collector loads at the amplifier transistors are themselves transistors.

Another specific object of this invention is to provide a controllable bidirectional differential transistor amplifier circuit wherein all of the transistors of the circuit are of the same conductivity type.

In summary, the foregoing objects are attained in the preferred embodiment of this invention by providing a differential transistor amplifier circuit having pairs of amplifier, load and control transistors all of the same conductivity type. One amplifier transistor drives current through the load in one direction when the circuit input is of one polarity, and the other amplifier transistor drives current through the load in the other direction when the circuit input is of the opposite polarity. Each load transistor is biased so that it becomes saturated when its associated amplifier transistor supplies the load current, thereby substantially eliminating undesirable power dissipation in the output or load circuits of the transistor amplifiers.

Figure 1:
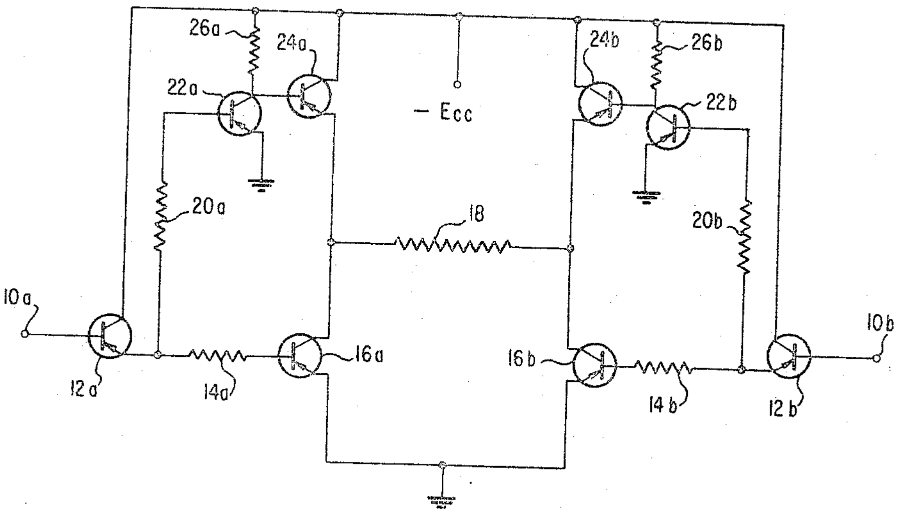
Figure 2:
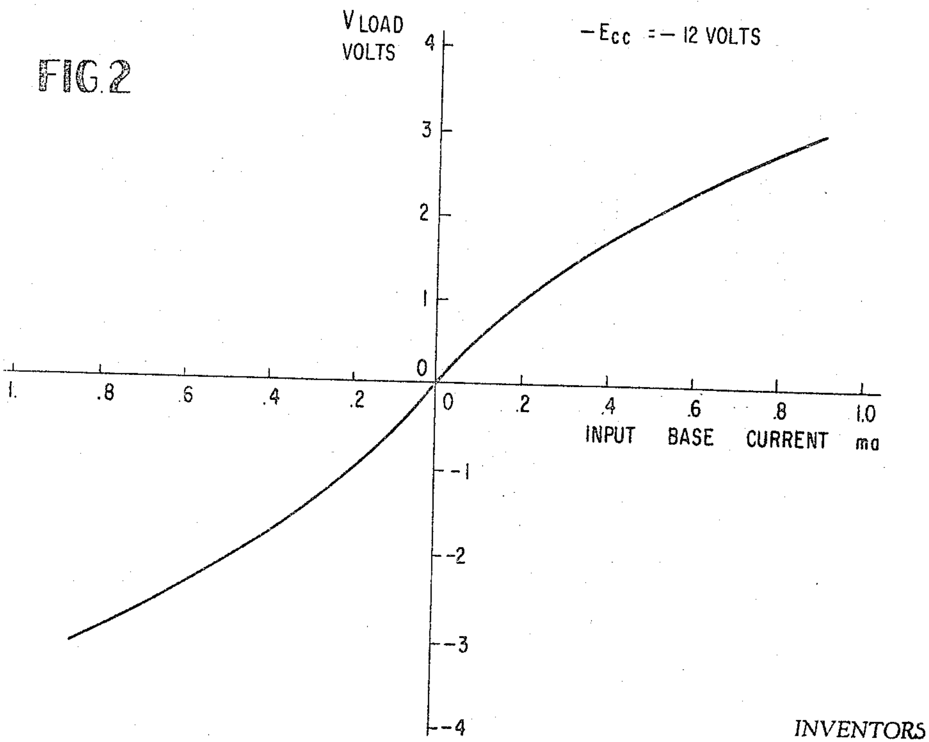

Other objects and features of this invention will become apparent from the following written description and the accompanying drawing wherein:

FIGURE 1 is a schematic circuit diagram of the preferred embodiment of this invention; and FIGURE 2 is a graph showing the relationship between load current and input current obtained by the circuit of FIGURE 1.

In FIGURE 1, there is shown a preferred embodiment of this invention in the form of a direct coupled transistor differential amplifier. Since this circuit is symmetrical, identical reference numerals will be used to identify corresponding components in the circuit together with the reference letter "*a*" to identify components on one side and the reference letter "*b*" to identify components on the other side.

A pair of input terminals **10*a*, 10*b* are respectively connected to the bases of a pair of PNP driver transistors 12*a*, 12*b* which are connected in an emitter follower configuration. The emitters of transistors 12*a*, 12*b* are respectively connected through corresponding emitter resistors 14*a*, 14*b* to the bases of a pair of amplifier PNP transistors 16*a*, 16*b* whose emitters are grounded. A resistive load 18 is connected across the collectors of transistors 16*a*, 16*b***.

In addition, the emitters of transistors **12*a*, 12*b* are respectively connected through corresponding resistors 20*a*, 20*b* to the bases of a pair of control transistors 22*a*, 22*b*. A pair of load transistors 24*a*, 24*b* are connected to the collectors of amplifier transistors 16*a*, 16*b*** in place of the usual collector resistors.

The base of transistor **24*a* is connected to the collector of control transistor 22*a*. The base of transistor 24*a* and the collector of control transistor 22*a* are returned through a common resistor 26*a* to the collector supply potential $-E_{cc}$. Furthermore, the emitter of transistor 24*a* is connected to one side of the load 18 and also to the collector of amplifier transistor 16*a***.

In like manner, the base of load transistor **24*b* and the collector of control transistor 22*b* are returned through a common resistor 26*b* to the collector supply potential $-E_{cc}$. The emitter of transistor 24*b* is connected to the other side of load 18 and to the collector of amplifier transistor 16*b***.

In operation, a differential or push-pull input signal is applied to the terminals **10*a*, 10*b*. When the bases of transistors 12*a*, 12*b* are both at ground potential, these transistors are cut off. Consequently, the bases of transistors 16*a*, 16*b* are also cut off so these transistors are nonconducting. In like manner, transistors 22*a*, 22*b* are cut off so that the bases of load transistors 24*a*, 24*b* are nearly at collector potential. However, transistors 24*a*, 24*b* cannot conduct because no collector-emitter current path is available since the amplifier transistors 16*a*, 16*b*** are nonconducting.

Let us now assume that an input signal causes terminal **10*a* to become negative with respect to ground and terminal 10*b* to become positive. Driver transistor 12*a* will now become conducting and drive transistor 16*a* into conduction. The emitter current flowing through resistor 14*a* is controlled by the magnitude of the potential on input terminal 10*a* and, therefore, the conduction of transistor 16*a* is under the control of driver transistor 12*a***.

Since the base of transistor **24*b* is still nearly at collector potential $-E_{cc}$ and since now there is a current path through load 18 and transistor 16*a* to ground, load transistor 24*b*** becomes nearly saturated and an amplified load current flows between ground and the collector supply.

Furthermore, since control transistor 22a is also driven by the emitter current of transistor 12a, it conducts and consequently its collector voltage (and thereby the base voltage of load transistor 24a) becomes less negative so that load transistor 24a conducts in less than a saturated state. As a result, most of the emitter current of amplifier transistor 16a flows through load 18 and load transistor 24b rather than through load transistor 24a. As the base potential of driver transistor 12a becomes more negative, more current flows through amplifier transistor 16a, and of that current, less flows through load transistor 24a so that the current through load 18 increases. As long as input terminal 10a remains negative, the magnitude of the current flowing through load 18, amplifier transistor 16a and load transistor 24b will vary in accordance with the magnitude of the potential on input terminal 10a.

However, when the signal applied to input terminals 10a, 10b reverses polarity so that the base of driver transistor 12b becomes negative with respect to ground and the base of driver transistor 12a becomes positive, the load current then flows from ground, through amplifier transistor 16b, load 18 and load transistor 24a to the collector supply —*Ecc*. Since the circuit is symmetrical, it is not necessary to repeat in detail the operation of the individual transistors for this reverse polarity of the input signal.

FIGURE 2 shows a graph representing the relationship between the current through load 18 and the signal current applied to the terminals 10a, 10b. It is important to note that the control of the load current is continuous through zero input current and that no discontinuity occurs at the zero point. Such a feature distinguishes this controllable amplifier circuit from the transistorized load switching circuits found in the prior art.

Following is a tabulation of the values of the components utilized in the circuit of FIGURE 1 to obtain the curve shown in FIGURE 2:

| | | |
|---|---|---|
| Transistors **12** and **22** | | 2N1038 |
| Transistors **16** and **24** | | 2N512 |
| Resistors **14** | ohms | 4.7 |
| Resistors **20** | ohms | 22 |
| Resistors **26** | ohms | 50 |
| —Ecc | volts | 12 |

In the preferred embodiment of this amplifier circuit shown in FIGURE 1, all PNP transistors and a negative supply potential have been used. Even though an important feature of this invention is that all of the transistors in the circuit are of the same conductivity type, it will be obvious to those skilled in the art that all NPN transistors may be used with a positive collector supply potential.

The foregoing description refers to a preferred embodiment of this invention and various modifications and improvements thereof will be apparent to those skilled in the art, and are therefore considered to be within the scope of this invention which is limited only as defined in the appended claims.

What is claimed is:

1. A bidirectional direct current differential amplifier for continuously and smoothly driving an amplified signal current through a load adapted to be connected to said amplifier comprising (a) a pair of input terminals adapted to receive a balanced input signal,
(b) first and second load terminals,
(c) a pair of driver transistors each having a collector, base and emitter, and each having its base connected to a different one of said input terminals,
(d) a pair of amplifier transistors each having a collector, base and emitter, and each having its base connected to the emitter of a corresponding one of said driver transistors and its collector connected to a different one of said load terminals,
(e) a pair of control transistors each having a collector, base and emitter, and each having its base connected to the emitter of the corresponding driver transistor,
(f) a pair of load transistors each having a collector, base and emitter, and each having its base connected to the collector of the corresponding control transistor and its emitter connected to one of said load terminals,
(g) first means for connecting the collectors of said load transistors to a source of collector supply potential, and
(h) second means for connecting the emitters of said control and amplifier transistors to a source of reference potential, whereby an input signal of one polarity renders one set of corresponding driver, amplifier, and control transistors and the non-corresponding one of said load transistors conducting to drive an amplified signal current in a first direction through a load connected between the collectors of said amplifier transistors, and an input signal of the opposite polarity renders the other set of corresponding driver, amplifier, and control transistors and the other of said load transistors conducting to drive an amplified signal current through the load in the opposite direction.

2. A bidirectional direct current differential amplifier as defined in claim 1 further comprising
(a) a source of collector supply potential connected to the collectors of said driver, amplifier and control transistors, and
(b) means connecting the base of each of said load transistors to said source so that as each amplifier transistor is rendered conducting to drive the load, its non-corresponding load transistor saturates while its corresponding load transistor becomes less conducting as said corresponding amplifier transistor becomes more conducting.

3. The bidirectional direct current differential amplifier as defined in claim 2 wherein all said transistors are of the same conductivity type.

References Cited

UNITED STATES PATENTS

| | | | |
|---|---|---|---|
| 2,936,345 | 5/1960 | Kinkel | 330—30 |
| 3,124,757 | 3/1964 | Heyser | 330—18 X |
| 3,229,217 | 1/1966 | Van Zeeland | 330—18 |

FOREIGN PATENTS

| | | |
|---|---|---|
| 1,142,633 | 1/1963 | Germany. |

ROY LAKE, *Primary Examiner.*

E. C. FOLSOM, E. F. PARIS, *Assistant Examiners.*